United States Patent
Pajkic et al.

(10) Patent No.: US 11,469,220 B2
(45) Date of Patent: Oct. 11, 2022

(54) COMPONENT AND METHOD FOR PRODUCING A COMPONENT

(71) Applicant: OSRAM OLED GmbH, Regensburg (DE)

(72) Inventors: Zeljko Pajkic, Regensburg (DE); Luca Haiberger, Regensburg (DE); Martin Brandl, Kelheim (DE)

(73) Assignee: OSRAM OLED GMBH, Regensburg (DE)

( * ) Notice: Subject to any disclaimer, the term of this patent is extended or adjusted under 35 U.S.C. 154(b) by 106 days.

(21) Appl. No.: 16/769,202

(22) PCT Filed: Dec. 7, 2018

(86) PCT No.: PCT/EP2018/083979
§ 371 (c)(1),
(2) Date: Jun. 2, 2020

(87) PCT Pub. No.: WO2019/141435
PCT Pub. Date: Jul. 25, 2019

(65) Prior Publication Data
US 2020/0343233 A1  Oct. 29, 2020

(30) Foreign Application Priority Data
Jan. 17, 2018 (DE) .......................... 102018100946.1

(51) Int. Cl.
*H01L 25/16* (2006.01)
*H01L 33/62* (2010.01)
(Continued)

(52) U.S. Cl.
CPC .......... *H01L 25/167* (2013.01); *H01L 23/045* (2013.01); *H01L 23/3107* (2013.01);
(Continued)

(58) Field of Classification Search
CPC ..... H01L 25/167; H01L 33/486; H01L 33/62; H01L 23/043–047; H01L 23/4951;
(Continued)

(56) References Cited

U.S. PATENT DOCUMENTS 5,500,628 A * 3/1996 Knecht ..................... H03B 5/32
310/348
5,523,608 A * 6/1996 Kitaoka .................. H01L 25/16
257/E31.118
(Continued)

FOREIGN PATENT DOCUMENTS

CN 102386309 A * 3/2012 ........... H01L 25/167
CN 104350617 A * 2/2015 ........... H01L 25/167
(Continued)

OTHER PUBLICATIONS

Machine translation, Oh, Korean Pat. Pub. No. KR102008286B1, translation date: Nov. 16, 2021, Espacenet, all pages. (Year: 2021).*
(Continued)

*Primary Examiner* — Victoria K. Hall
(74) *Attorney, Agent, or Firm* — ArentFox Schiff LLP (57) ABSTRACT

The invention relates to a component comprising a first part, a second part, a housing body, and a first electrode, wherein the housing body encloses the first electrode in lateral directions at least in some regions. The first electrode has a front face and a rear face facing away from the front face, and the front and rear faces are free of a cover produced by a material of the housing body at least in some regions. The first part is arranged on the front face, and the second part is arranged on the rear face, and both the first and second parts are connected to the first electrode in an electrically conductive manner. The first electrode is designed to be continuous and is arranged between the first part and the
(Continued)

second part in the vertical direction. Also described is a method for producing the component.

11 Claims, 7 Drawing Sheets

(51) Int. Cl.
| | |
|---|---|
| H01L 33/48 | (2010.01) |
| H01L 23/31 | (2006.01) |
| H01L 23/495 | (2006.01) |
| H01L 31/147 | (2006.01) |
| H01L 31/0203 | (2014.01) |
| H01L 31/02 | (2006.01) |
| H01L 23/045 | (2006.01) |
| H01L 33/50 | (2010.01) |

(52) U.S. Cl.
CPC ...... *H01L 23/4951* (2013.01); *H01L 31/0203* (2013.01); *H01L 31/02005* (2013.01); *H01L 31/147* (2013.01); *H01L 33/486* (2013.01); *H01L 33/62* (2013.01); *H01L 33/50* (2013.01); *H01L 2933/0066* (2013.01)

(58) Field of Classification Search
CPC ........... H01L 2933/0066; H01L 31/147; H01L 2225/1029; H01L 33/48–486
See application file for complete search history.

(56) References Cited

U.S. PATENT DOCUMENTS

| | | | | |
|---|---|---|---|---|
| 6,333,856 | B1* | 12/2001 | Harju | H01L 23/13 |
| | | | | 257/723 |
| 6,337,510 | B1* | 1/2002 | Chun-Jen | H01L 25/0657 |
| | | | | 257/E23.047 |
| 6,372,551 | B1* | 4/2002 | Huang | H01L 23/047 |
| | | | | 257/E23.052 |
| 6,588,946 | B1* | 7/2003 | Mitsui | H01L 25/167 |
| | | | | 250/239 |
| 6,653,661 | B2* | 11/2003 | Okazaki | H01L 33/54 |
| | | | | 257/100 |
| 6,821,817 | B1* | 11/2004 | Thamby | H01L 23/10 |
| | | | | 257/E23.052 |
| 6,893,169 | B1* | 5/2005 | Exposito | H01L 25/167 |
| | | | | 385/94 |
| 7,102,220 | B2* | 9/2006 | Stevens | H01L 23/055 |
| | | | | 257/686 |
| 7,282,786 | B2* | 10/2007 | Jung | G01L 19/141 |
| | | | | 257/666 |
| 7,679,090 | B2* | 3/2010 | Huang | H01L 25/167 |
| | | | | 257/81 |
| 7,714,349 | B2* | 5/2010 | Su | H01L 25/167 |
| | | | | 257/99 |
| 7,868,471 | B2* | 1/2011 | Camacho | H01L 23/3135 |
| | | | | 257/E23.126 |
| 7,964,420 | B2* | 6/2011 | Wang | H01L 25/167 |
| | | | | 438/26 |
| 8,030,674 | B2* | 10/2011 | Hsu | H01L 33/60 |
| | | | | 257/676 |
| 8,193,540 | B2* | 6/2012 | Huang | H01L 25/167 |
| | | | | 257/81 |
| 8,471,285 | B2* | 6/2013 | Hsu | H01L 33/60 |
| | | | | 257/98 |
| 8,669,581 | B2* | 3/2014 | Jung | H01L 33/486 |
| | | | | 257/99 |
| 9,064,856 | B1* | 6/2015 | Huang | H01L 25/167 |
| 9,431,375 | B2* | 8/2016 | Defretin | H01L 23/10 |
| 10,522,505 | B2* | 12/2019 | Hung | H01L 23/31 |
| 10,923,461 | B2* | 2/2021 | Huang | H01L 25/167 |
| 2004/0159955 | A1* | 8/2004 | Shen | H01L 25/16 |
| | | | | 257/E25.023 |
| 2004/0208210 | A1* | 10/2004 | Inoguchi | H01L 33/486 |
| | | | | 372/36 |
| 2005/0051884 | A1* | 3/2005 | Stevens | H01L 23/5385 |
| | | | | 257/686 |
| 2005/0275082 | A1 | 12/2005 | Ferrara et al. | |
| 2006/0113906 | A1* | 6/2006 | Ogawa | C04B 35/584 |
| | | | | 313/512 |
| 2007/0013038 | A1* | 1/2007 | Yang | H01L 23/49548 |
| | | | | 257/E25.023 |
| 2007/0018191 | A1* | 1/2007 | Roh | H01L 25/167 |
| | | | | 257/99 |
| 2008/0099779 | A1* | 5/2008 | Huang | H01L 25/167 |
| | | | | 257/99 |
| 2009/0115049 | A1* | 5/2009 | Shiraishi | B81C 1/0023 |
| | | | | 257/E23.18 |
| 2009/0174048 | A1* | 7/2009 | Liu | H01L 23/49575 |
| | | | | 257/676 |
| 2009/0179318 | A1* | 7/2009 | Chen | H01L 25/105 |
| | | | | 257/738 |
| 2009/0267104 | A1* | 10/2009 | Hsu | H01L 33/60 |
| | | | | 257/E33.058 |
| 2010/0032709 | A1* | 2/2010 | Huang | H01L 25/167 |
| | | | | 257/99 |
| 2010/0123257 | A1* | 5/2010 | Liu | H01L 25/0657 |
| | | | | 438/109 |
| 2010/0295089 | A1* | 11/2010 | Kim | H01L 25/167 |
| | | | | 257/99 |
| 2011/0233594 | A1* | 9/2011 | Hsu | H01L 33/60 |
| | | | | 257/98 |
| 2011/0278601 | A1* | 11/2011 | Hsieh | H01L 33/486 |
| | | | | 257/88 |
| 2011/0284888 | A1* | 11/2011 | Nishiyama | H01L 33/647 |
| | | | | 257/91 |
| 2011/0309406 | A1* | 12/2011 | Inoguchi | H01L 33/486 |
| | | | | 257/99 |
| 2012/0020026 | A1* | 1/2012 | Oganesian | H01L 23/5389 |
| | | | | 361/728 |
| 2012/0049237 | A1* | 3/2012 | Hata | H01L 25/167 |
| | | | | 257/99 |
| 2012/0228754 | A1* | 9/2012 | Liu | A61P 19/00 |
| | | | | 257/676 |
| 2014/0145633 | A1* | 5/2014 | Seo | H01L 33/486 |
| | | | | 315/200 R |
| 2015/0048390 | A1* | 2/2015 | Imazu | H01L 33/60 |
| | | | | 257/88 |
| 2015/0084174 | A1* | 3/2015 | van Straten | H01L 23/49551 |
| | | | | 257/676 |
| 2015/0294957 | A1* | 10/2015 | Shih | H01L 23/4951 |
| | | | | 257/773 |
| 2016/0254424 | A1* | 9/2016 | Zitzlsperger | H01L 33/54 |
| | | | | 257/88 |
| 2016/0306042 | A1* | 10/2016 | Schrank | H01L 31/02164 |
| 2017/0053903 | A1* | 2/2017 | Nishimura | H01L 25/50 |
| 2017/0278763 | A1* | 9/2017 | Li | H01L 23/3157 |
| 2017/0278768 | A1* | 9/2017 | Higgins, III | H01L 21/4828 |
| 2017/0284880 | A1* | 10/2017 | Beer | H01L 23/49811 |
| 2017/0365589 | A1* | 12/2017 | Inoguchi | H01L 25/167 |
| 2018/0024353 | A1* | 1/2018 | Tanaka | H01L 24/00 |
| | | | | 257/113 |
| 2018/0166614 | A1* | 6/2018 | Richter | G02B 5/0242 |
| 2018/0306638 | A1* | 10/2018 | Ishikawa | G01J 3/0229 |
| 2019/0035773 | A1* | 1/2019 | Lo | H01L 33/52 |
| 2019/0207051 | A1* | 7/2019 | Utsumi | H01L 31/12 |

FOREIGN PATENT DOCUMENTS

| | | | | |
|---|---|---|---|---|
| CN | 102856316 B | * | 12/2016 | ............ H01L 25/167 |
| DE | 102014113844 A1 | | 3/2016 | |
| DE | 102014114372 A1 | | 4/2016 | |
| EP | 2693166 A1 | | 2/2014 | |
| JP | H5-29662 | * | 2/1993 | ............ H01L 33/00 |
| JP | H0537021 A | | 2/1993 | |
| JP | H10-144965 A | * | 5/1998 | ............ H01L 25/167 |
| JP | H10144965 A | | 5/1998 | |
| JP | 2000-124506 A | * | 4/2000 | ............ H01L 33/00 |
| JP | 2003-304004 A | * | 10/2003 | ............ H01L 33/00 |

(56) References Cited

FOREIGN PATENT DOCUMENTS

| KR | 10-0745441 B1 | * | 7/2007 | ............ H01L 23/02 |
|---|---|---|---|---|
| KR | 10-0748241 B1 | * | 8/2007 | ............ H01L 33/00 |
| KR | 10-2008-0062505 A | * | 7/2008 | ............ H01L 33/00 |
| KR | 10-2014-0061796 A | * | 5/2014 | ............ H01L 33/48 |
| KR | 10-2008286 B1 | * | 8/2019 | ............ H01L 33/48 |
| WO | WO-2012122388 A2 | * | 9/2012 | ............ H01L 23/13 |

OTHER PUBLICATIONS

Machine translation, Tsutsui, Korean Pat. Pub. No. KR100748241B1, translation date: Nov. 16, 2021, Espacenet, all pages. (Year: 2021).*
Machine translation, Ishizaki, Japanese Pat. Pub. No. JPH0529662A, translation date: Nov. 16, 2021, Espacenet, all pages. (Year: 2021).*
Machine translation, Kim, Korean Pat. Pub. No. KR20080062505A, translation date: Nov. 16, 2021, Espacenet, all pages. (Year: 2021).*
Machine translation, Okazaki, Japanese Pat. Pub. No. JP2000124506A, translation date: Nov. 16, 2021, Espacenet, all pages. (Year: 2021).*
Machine translation, Wakatsuki, Japanese Pat. Pub. No. JP2003304004A, translation date: Nov. 16, 2021, Espacenet, all pages. (Year: 2021).*
Machine translation, Yoon, Korean Pat. Pub. No. KR100745441B1, translation date: Nov. 16, 2021, Espacenet, all pages. (Year: 2021).*
Written Opinion of International Searching Authority, International Application No. PCT/EP2018/083979, dated Mar. 20, 2019, all pages. (Year: 2019).*
Machine translation, Hata, Chinese Pat. Pub. No. CN-102386309-A, Clarivate Analytics, translation date: Apr. 14, 2022, all pages. (Year: 2022).*
Machine translation, Fukumitsu, Chinese Pat. Pub. No. CN-104350617-A, Clarivate Analytics, translation date: Apr. 14, 2022, all pages. (Year: 2022).*
Machine translation, Lee, Chinese Pat. Pub. No. CN-102856316-B, Clarivate Analytics, translation date: Apr. 14, 2022, all pages. (Year: 2022).*
Machine translation, Sakakibara, Japanese Pat. Pub. No. JP H10-144965A, Espacenet, translation date: Apr. 13, 2022, all pages. (Year: 2022).*
International Search Report PCT/EP2018/083979 dated Mar. 20, 2019.

* cited by examiner

COMPONENT AND METHOD FOR PRODUCING A COMPONENT

CROSS-REFERENCE TO RELATED APPLICATIONS

This application is a U.S. National Stage of PCT/EP2018/083979 filed Dec. 7, 2018, which claims priority to German Application No. 10 2018 100 946.1 filed Jan. 17, 2018, the entirety of each of which is incorporated by reference herein.

TECHNICAL FIELD

A component is provided. Methods for producing a component or a multiplicity of components are furthermore provided.

BACKGROUND

In the case of modern electronic devices such as smartphones or tablets, it is often desirable to equip these devices with various emitters and sensors on different sides. The layer thickness of such devices is restricted inter alia by the layer thicknesses of the emitters and sensors. Since the current trend is toward ever thinner devices, the installed component parts should have overall heights that are as small as possible.

SUMMARY

It is an object to provide a compact and mechanically stable component having a particularly low overall height. A simplified and economical method for producing a component or a multiplicity of components is furthermore provided.

These objects are achieved by a component as claimed in the independent claim and/or in connection with such a component. The further claims relate to further configurations and refinements of the component and of the method for producing a component.

According to at least one embodiment of a component, it comprises a first part and a second part. The first part and the second part may respectively be an electrical part. The electrical part may be a diode, an optoelectronic semiconductor chip, in particular a light-emitting semiconductor chip, a sensor, for instance a light-detecting sensor, or an integrated-circuit chip.

According to at least one embodiment of the component, it comprises a housing body and/or a first electrode. In particular, the first electrode is enclosed by the housing body in lateral directions at least in regions, or fully. The first electrode comprises a front side and a rear side facing away from the front side. In particular, the front side and/or the rear side of the first electrode are/is respectively free of coverage by a material of the housing body at least in regions in plan view. In other words, the front side and/or the rear side of the first electrode may be uncovered by the housing body in regions in plan view.

For example, the housing body is formed from an electrically insulating material, for instance from a plastic. The material of the housing body may be configured to be radiation-transmissive, preferably radiation-opaque, for instance radiation-reflective or radiation-absorbent. The material of the housing body may comprise radiation-reflective and/or radiation-absorbent particles. If the first part or the second part is arranged on the first electrode, this part may comprise a surface which is free of coverage by the housing body in plan view and, in particular, is configured as a radiation transmission surface of the part. In a plan view of the first electrode, the first part and/or the second part may be free, in particular entirely free, of coverage by a material of the housing body.

A lateral direction is intended to mean a direction which, in particular, extends parallel to a main extent surface of the component, in particular of the first electrode. For example, a mounting surface of the first and/or second part extends parallel to the lateral direction of the component. The mounting surface may be formed at least in regions by a surface of the first electrode. A vertical direction is intended to mean a direction which, in particular, is directed perpendicularly to the main extent surface of the component and/or of the first electrode. The vertical direction and the lateral direction are for instance orthogonal to one another.

According to at least one embodiment of the component, the first part is arranged on the front side of the first electrode. The second part is, for instance, arranged on the rear side of the first electrode. The first part and/or the second part are/is in particular electrically conductively connected to the first electrode. In the vertical direction, the first electrode is, for example, arranged between the first part and the second part. The first electrode may be formed to be continuous. The parts are therefore, in particular, arranged on either side on the first electrode. The component is, for instance, a component equipped with parts on both sides. In a plan view of the first electrode, the parts arranged on different sides of the electrode may have overlaps.

It is possible for the component to comprise a multiplicity of first parts on the front side and/or a multiplicity of second parts on the rear side of the first electrode. The first parts and/or the second parts may be electrical parts such as light-emitting semiconductor chips, light-detecting semiconductor chips or sensors.

It is conceivable for the component to comprise a multiplicity of first electrodes, which are for instance arranged spatially separated and are preferably laterally enclosed by the same housing body. Each of the first electrodes is preferably configured to be continuous and comprises, in particular, at least one part of a plurality of parts both on its front side and on its rear side. It is also possible for the component to comprise a single continuous first electrode.

In at least one embodiment of the component, it comprises a first part, a second part, a housing body and a first electrode. The housing body encloses the first electrode at least in regions or fully in the lateral directions. The first electrode comprises a front side and a rear side facing away from the front side, the front side and the rear side being free of coverage by a material of the housing body at least in regions. The first part is arranged on the front side and is electrically conductively connected to the first electrode. The second part is arranged on the rear side and is electrically conductively connected to the first electrode. In the vertical direction, the first electrode is arranged between the first part and the second part. In particular, the first electrode is formed to be continuous. The first electrode may be formed in one piece. The first part and/or the second part may be arranged directly on the first electrode except for a connection layer, for instance except for a bonding or solder layer.

In such a configuration, the component is equipped on both sides with parts, in particular with optoelectronic semiconductor chips and/or sensors. The first electrode of the component may be configured as a carrier both for the first part and for the second part, the parts being arranged on different sides of the carrier. The parts, in particular, the electrical parts, may be mounted and optionally electrically contacted on both sides of the first electrode, i.e. on both sides of the same carrier. In this way, the overall vertical height of the component may be reduced significantly.

According to at least one embodiment of the component, the first part and/or the second part adjoin/adjoins the first electrode directly at most except for a connection layer. The connection layer is for example an electrically conductive layer, for instance a bonding or solder layer. In particular, the first electrode is formed to be self-supporting. Preferably, the first electrode has a minimum vertical thickness of about 75 µm or 100 µm. For example, the vertical layer thickness of the first electrode is between 75 µm and 500 µm inclusive, preferably between 100 µm and 350 µm inclusive, or between 150 µm and 250 µm inclusive.

For example, the first electrode is formed from copper, iron or from a copper-iron alloy. The first electrode may comprise Zn, P, Au, Ag, NiAu and/or NiAg. It is possible for the first electrode to comprise a main body, for instance consisting of a Cu—Fe alloy, the main body being coated in particular with Au, NiAu, Ag and/or NiAg. For example, at least 90, 95 or at least percent by weight (wt %) of the first electrode may be constituted by Cu. The proportion of Fe may be between 2.1 wt % and 2.6 wt % inclusive. The proportion of Zn may be between 0.05 wt % and 0.2 wt % inclusive. The proportion of P may be between 0.015 wt % and 0.15 wt % inclusive.

According to at least one embodiment of the component, the housing body comprises a cavity. In particular, the first part or the second part is arranged in the cavity. The cavity has a bottom surface, which may be formed at least in regions by a surface of the first electrode. The cavity is therefore an opening of the housing body, the cavity being enclosed, in particular fully enclosed, in lateral directions by the housing body. The side walls of the cavity may be formed by surfaces of the housing body.

The housing body may comprise a first cavity and a second cavity. The bottom surfaces of the cavities may be formed at least in regions by surfaces of the continuous first electrode. The first part and the second part are, for instance, arranged in the first cavity and in the second cavity, respectively. The first cavity and the second cavity of the housing body may be spatially separated from one another in the vertical direction by the first electrode. In other words, the first continuous electrode may be arranged between the first cavity and the second cavity of the housing body in the vertical direction. The housing body may comprise a multiplicity of such first cavities and/or a multiplicity of such second cavities.

According to at least one embodiment of the component, the first part or the second part is a light-emitting semiconductor chip. It is also possible for the first part and the second part respectively to be a light-emitting semiconductor chip. It is also possible for the first part to be a light-emitting semiconductor chip and for the second part to be a sensor, or vice versa. For example, the component is formed as a flashlight or as an illumination device, in particular for a smartphone or a tablet.

According to at least one embodiment of the component, it comprises a second electrode. The second electrode is, in particular, electrically conductively connected to the first part and/or to the second part. It is possible for the first electrode and/or the second electrode to adjoin the housing body directly. For example, the first electrode and the second electrode are formed from the same material. The first electrode and the second electrode may have the same vertical layer thickness. In particular, the first electrode and the second electrode are separated from one another laterally and are held together by the housing body, in particular held together only by the housing body. The second electrode may be configured to be continuous. As an alternative, it is possible for the second electrode to comprise at least two or more subregions spatially separated from one another. The subregions of the second electrode may be held together by the housing body.

The first electrode and the second electrode are adapted for electrical contacting of the parts. Expediently, the first electrode and the second electrode are assigned different electrical polarities of the component. In lateral directions, the first electrode and/or the second electrode may be partially or fully enclosed by the housing body. It is possible for the second electrode to be exposed in regions or electrically contactable in a cavity or in the cavities of the housing body. The first part and/or the second part may be arranged in regions on the first electrode and in regions on the second electrode. In a plan view of the bottom surface of the cavity, the first part and/or the second part may cover both the first electrode and the second electrode in regions. The bottom surface of the first cavity and/or of the second cavity may in places be formed by surfaces of the first electrode, of the second electrode and/or of the housing body.

According to at least one embodiment of the component, the second electrode is formed to be continuous, particularly in one piece. The first part and/or the second part or all parts of the component may be externally electrically contacted via the first and second electrodes. As an alternative, it is possible for the second electrode to comprise a multiplicity of spatially separated subregions, the subregions of the second electrode being adapted for electrical contacting of different parts.

For example, the first part is electrically conductively connected to a first subregion of the second electrode, while the second part is electrically conductively connected to a second subregion of the second electrode. The first part and the second part of the component may be switched on or off independently of one another or electronically controlled independently of one another. For example, parts that are arranged in different cavities of the housing body are electrically conductively connected to different subregions of the second electrode. The parts in different cavities of the housing body may thus be electrically controllable individually.

According to at least one embodiment of the component, it comprises a front-side main surface and a rear-side main surface. In particular, the main surfaces delimit the component in the vertical directions. For example, the front-side main surface is formed at least in regions by a front side of the housing body. The rear-side main surface of the component may be formed at least in regions by a rear side of the housing body. The component has an overall vertical height which, in particular, is substantially dictated by the vertical layer thickness of the housing body. For example, a ratio of the vertical layer thickness of the housing body to the overall height of the component is between 0.6 and 1 inclusive, for instance between 0.8 and 1 inclusive, preferably between 0.9 and 1 inclusive, or between 0.95 and 1 inclusive. The vertical layer thickness of the housing body is, in particular, greater than the vertical layer thickness of the first electrode and/or of the second electrode. Preferably, the overall vertical height of the component is between 100 µm and 2000 µm inclusive, in particular between 150 µm and 1000 µm inclusive, preferably between 350 µm and 700 µm inclusive.

According to at least one embodiment of the component, it is formed as a surface-mountable component. The component may be externally electrically contactable via the front-side main surface and/or via the rear-side main surface. For example, the component is configured in such a way that it is externally electrically contactable only via the front-side main surface or via the rear-side main surface. As an alternative, it is possible for the component to comprise side surfaces, the component being configured to be externally electrically contactable partially or only via the side surfaces.

According to at least one embodiment of the component, the first electrode and/or the second electrode are/is fully enclosed by the housing body in lateral directions. The component is, in particular, electrically contactable on the front-side main surface or on the rear-side main surface of the component. In particular, the first electrode and the second electrode are electrically contactable on the same main surface of the component.

According to at least one embodiment of the component, it comprises side surfaces. In particular, all side surfaces of the component are formed by side surfaces of the housing body. For example, all side surfaces of the component are free of an electrically conductive material and/or free of electrical connection positions of the component. The electrical contacting of the component may be carried out only by the front side and/or the rear side of the component or of the housing body. The component is in particular a QFN component, i.e. a quad flat no-leads package.

According to at least one embodiment of the component, the first electrode and/or the second electrode are/is electrically contactable on a side surface or on different side surfaces of the housing body or of the component. For example, the first electrode and/or the second electrode extend/extends laterally as far as the side surface of the housing body or may protrude laterally beyond a side surface of the housing body. A connection position or a connection surface, which is electrically conductively connected to the first electrode or to the second electrode, may be arranged on the side surface of the component. The first electrode and/or the second electrode may be externally electrically contacted via the connection position or connection positions on the side surface or on different side surfaces of the component. In particular, the second electrode may comprise a multiplicity of subregions, which are externally electrically contactable on a side surface or respectively on one of the side surfaces of the component or of the housing body.

In a method for producing a component or a multiplicity of components, a lead frame having a first, in particular continuous, electrode is provided. In the case of the production of a multiplicity of components, the lead frame may comprise a multiplicity of such continuous first electrodes.

A housing body is formed, in particular by means of a molding method. The first electrode or the multiplicity of first electrodes may be laterally enclosed by the housing body, in such a way that the first electrode comprises a front side and a rear side facing away from the front side, which at least in regions are free of coverage by a material of the housing body. The housing body may be applied onto the first electrode in a structured fashion. The first electrode may comprise regions which remain uncovered by a material of the housing body during the formation of the housing body. As an alternative, it is possible for the housing body initially to be formed surface-wide on the first electrode and to be removed in regions in a subsequent method step for partial exposure of the first electrode.

A molding method is generally intended to mean a method with which a molding compound may be configured according to a predetermined shape, preferably by the action of pressure, and if required cured. In particular, the term "molding method" includes at least molding, injection molding, transfer molding and compression molding.

A first part or a multiplicity of first parts may be fixed on the front side of the first electrode after the formation of the housing body. The second part or the multiplicity of second parts may be fixed on the rear side of the first electrode after the formation of the housing body. In the vertical direction, the first electrode is arranged in particular between the first part and the second part. Preferably, the first electrode is electrically conductively connected both to the first part and to the second part.

In such a method, the parts are preferably not fixed on the first electrode, and in particular not electrically conductively connected thereto, until after the formation of the housing body. As an alternative, it is possible for the parts initially to be fixed on the first electrode before the housing body is formed around the first electrode and/or the parts.

According to at least one embodiment of the method, a lead frame having a first, in particular continuous, electrode is provided, the first electrode comprising a front side and a rear side facing away from the front side. A first part is fixed on the front side of the first electrode. A second part is fixed on the rear side of the first electrode, the first electrode being arranged between the first part and the second part in the vertical direction. Preferably, the first electrode is electrically conductively connected both to the first part and to the second part. Preferably, a housing body is formed by means of a film-assisted molding method after the fixing of the parts, so that the first electrode is laterally enclosed by the housing body in such a way that the front side and the rear side of the first electrode are respectively free of coverage by a material of the housing body at least in regions in plan view. The effect achievable in this way is that the parts are uncovered by the housing body in a plan view of the first electrode.

If the part is not adapted for radiation generation and/or for radiation detection, it is conceivable for this part to be covered by the housing body or by a radiation-opaque material in plan view. If a multiplicity of components are produced, it is preferable that a housing body panel is initially formed, which is divided into a multiplicity of housing bodies in a subsequent method step, the housing bodies being in particular respectively assigned to one of the components. The housing bodies may respectively laterally enclose a first, in particular continuous, electrode and/or a second electrode of the associated component partially or fully.

The method described herein is particularly suitable for the production of a component described herein or a multiplicity of the components described herein. The features described in connection with the component may therefore also be used for the method, and vice versa.

BRIEF DESCRIPTION OF THE DRAWINGS

Further preferred embodiments and refinements of the component and of the method may be found from the exemplary embodiments explained below in connection with FIGS. 1A to 5E, in which.

Elements which are the same or of the same type, or which have the same effect, are provided with the same references in the figures. The figures are respectively schematic representations and are therefore not necessarily true to scale. Rather, relatively small elements, and in particular layer thicknesses, may be represented exaggeratedly large for illustration.

DETAILED DESCRIPTION

Figure 1A:
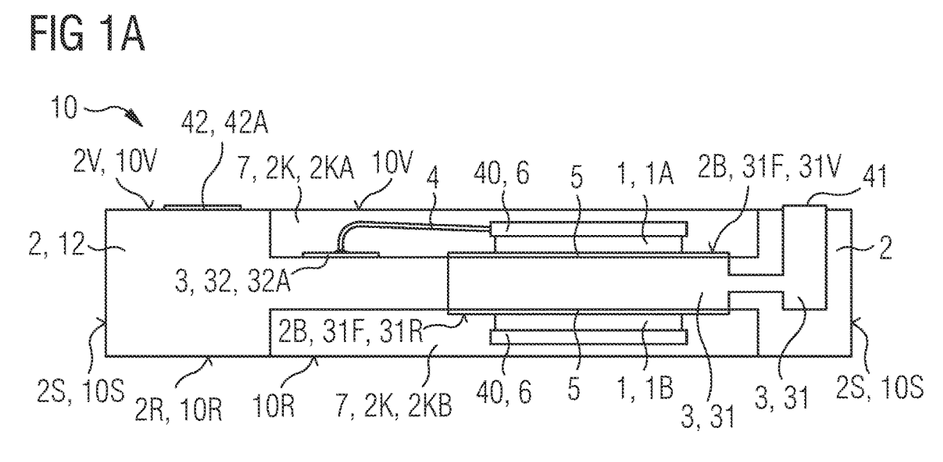
FIGS. 1A, 1B and 1C show one exemplary embodiment of a component in a sectional view, in a plan view of a front side of the component and in a plan view of a rear side of the component.

FIG. 1A schematically represents a component 10 in a sectional view. The component comprises a housing 12. In vertical directions, the component 10 comprises a front-side main surface 10V and a rear-side main surface 10R facing away from the front-side main surface 10V. In particular, the front-side main surface 10V and the rear-side main surface 10R are formed in regions by surfaces of the housing 12.

The housing 12 comprises a housing body 2. In particular, the front-side main surface 10V and the rear-side main surface 10R of the component 10 are formed by surfaces of the housing body 2. The component 10 comprises vertically extending side surfaces 10S, the vertical side surfaces 10S connecting the front-side main surface 10V to the rear-side main surface 10R. In particular, all side surfaces 10S of the component 10 are formed only by side surfaces 2S of the housing body 2 or of the housing 12. The front-side main surface 10V of the component 10 may be formed in regions by a front side 2V of the housing body 2. The rear-side main surface 10R of the component 10 may be formed in regions by a rear side 2R of the housing body 2.

The component 10 comprises a multiplicity of parts 1, in particular a multiplicity of electrical parts 1. The part 1 may be a radiation-emitting or radiation-detecting semiconductor chip. The part 1 may also be a sensor, for instance a light sensor, or an integrated-circuit chip for the control of a sensor or of an optoelectronic semiconductor chip.

In FIG. 1A, the component 10 comprises a first part 1A and a second part 1B. Preferably, the component 10 comprises at least one part 1A or 1B which is an optoelectronic semiconductor chip, in particular a light-emitting semiconductor chip.

According to FIG. 1A, the component 10 comprises at least one cavity 2K. The cavity 2K, or the first cavity 2KA, is in particular an opening of the housing body 2 or of the housing 12. In lateral directions, the cavity 2K is fully enclosed by the main body 2. The first part 1A is arranged in the first cavity 2KA.

The component 10 comprises a first electrode 31. The first electrode 31 is, in particular, a portion of a lead frame 3, the lead frame 3 being adapted for electrical contacting of the part 1, in particular of the first part 1A. The lead frame 3 may comprise a second electrode 32, which is represented only in regions in FIG. 1A. By means of the first electrode 31 and the second electrode 32, the first part 1A may be externally electrically contacted. For example, the first part 1A is arranged directly, for instance except for a connection layer 5, on the first electrode 31. By means of an electrical connection 4, for instance by means of a connection wire or bond wire 4, the first part 1A may be electrically conductively connected to the second electrode 32.

The component 10 or the housing body 2 comprises a second cavity 2KB, in which the second part 2B is arranged. The second cavity 2KB is open toward the rear side 2R of the housing body 2 or toward the rear-side main surface 10R of the component 10. The first cavity 2KA, in which the first part 2A is arranged, is open toward the front side 2V of the housing body 2, or toward the front-side main surface 10V, of the component 10.

The first electrode 31 is enclosed at least in regions or fully by the housing body 2 in the lateral directions. It is possible for the first electrode 31 to be exposed in regions in the first cavity 2KA and/or in the second cavity 2KB, or to be uncovered by the housing body 2 in regions in plan view. In FIG. 1A, the first electrode 31 is arranged in regions between the first cavity 2KA and the second cavity 2KB in the vertical direction. In a plan view of the first electrode 31, the first cavity 2KA and the second cavity 2KB have overlaps. In particular, the first cavity 2KA and the second cavity 2KB are vertically separated from one another only by the first electrode 31.

The first cavity 2KA comprises a bottom surface 2B. In particular, the bottom surface 2B is formed in regions by a surface 31F of the first electrode 31. In FIG. 1A, the bottom surface 2B of the first cavity 2KA is formed in regions by a front side 31V of the first electrode 31. A bottom surface 2B of the second cavity 2KB is formed in regions by a rear side 31R of the first electrode 31. It is possible for the bottom surface 2B of the cavity 2K to be formed in regions by a surface of the housing body 2, by the surface 31F of the first electrode 31 and/or by a surface 32F of the second electrode 32.

For example, the bottom surface 2B of the first cavity 2KA may be formed in regions by the front side 31V of the first electrode 31, by the front side 2V of the housing body 2 and by the front side 32V of the second electrode 32. The bottom surface 2B of the second cavity 2KB, on the other hand, may be formed in regions by the rear side 31R of the first electrode 31, by the rear side 32R of the second electrode 32 and in regions by the rear side 2R of the housing body 2.

The housing body 2 is molded around the first electrode 31 in such a way that, in regions, the front side 31V and the rear side 31R of the first electrode are exposed or not covered by the housing body 2 in the regions of the cavities 2K in plan view. In other words, the first electrode 31 is at least in regions not covered by a material of the housing body 2 in the regions of the cavities 2K. The subregions of the first electrode 31 that are uncovered by the housing body 2 in the regions of the cavities 2K may be used as a mounting surface for the parts 1, 1A and 1B. It is possible for the mounting surface for the parts 1 to be formed only by an uncovered surface of the electrode 31, the uncovered surface being free of coverage by the housing body 2 in plan view.

According to FIG. 1A, the front side 31V and the rear side 31R of the first electrode 31 are used as a respective mounting surface for the first part 1A and for the second part 1B, respectively. In contrast to FIG. 1A or 1B, a multiplicity of first parts 1A may be arranged on the front side 31V of the first electrode 31 and/or a multiplicity of second parts 1B may be arranged on the rear side 31R of the first electrode 31. It is possible for a multiplicity of parts 1 to be arranged in a common cavity 2K, for instance 2KA or 2KB.

According to FIG. 1A, the first electrode 31 is configured in such a way that the first electrode 31 is electrically contactable outside the cavities 2K on the front side 2V of the housing body 2 or on the front-side main surface 10V of the component 10. On the front-side main surface 10V or on the front side 2V of the housing body 2, the component 10 comprises a first connection position 41, which in particular is assigned to a first electrical polarity of the component 10 or of the part 1, 1A and/or 1B. The first connection position 41 may be a partial surface of the first electrode 31. As an alternative, it is possible for the first connection position 41 to be a surface of a contact layer, which is in electrical contact with the first electrode 31.

On the front-side main surface 10V or on the front side 2V of the housing body 2, the component 10 comprises a second connection position 42. In particular, the second connection position 42 is assigned to a second electrical polarity of the component 10 or of the part 1, 1A and/or 1B. In a similar way to the first connection position 41, the second connection position 42 may be located outside the cavities 2K. The second connection position may be a surface of the second electrode 32. As an alternative, it is possible for the second connection position 42 to be formed by a surface of a different contact layer, which is in electrical contact with the first electrode 32.

The second connection position 42 represented in FIG. 1A may be a second connection position 42A of the first part 1A. It is possible for the component 10 to comprise a further second connection position 42, which is for instance formed as a second connection position 42B of the second part 1B, on the front-side main surface 10V or on the front side 2V of the housing body 2.

It is possible for the second connection position 42A and the further second connection position 42B to be electrically insulated from one another. The first part 1A and the second part 1B may comprise the same first electrode 31 and the same first connection position 41 but different second connection positions 42A and 42B. In this case, the first part 1A and the second part 1B may be connected and/or controlled independently of one another. As an alternative, it is possible for the first part 1A and the second part 1B to comprise both the same first connection position 41 and the same second connection position 42.

In FIG. 1A, the first connection position 41 and the second connection position 42 are arranged on the front-side main surface of the part 10, or on the front side 2V of the housing body 2, in particular outside the cavity 2K. The component 10 is electrically contactable via the front side 2V or via the front-side main surface 10V. The rear-side main surface 10R of the component 10 or the rear side 2R of the housing body 2 may be free of electrical connection positions of the component 10. In contrast to FIG. 1A, it is possible for all connection positions 41 and 42 to be located on the rear-side main surface 10R of the component or on the rear side 2R of the housing body 2. The front side 2V of the housing body 2 or the front-side main surface 10V of the component 10 may be free of the connection positions 41 and 42. According to FIG. 1A, all side surfaces 10S of the component 10 and/or all side surfaces 2S of the housing body 2 may be free of an electrically conductive material and/or free of electrical connection positions 41 and 42.

The part 1, 1A or 1B may comprise a connection layer 40, the connection layer 40 being arranged on a surface of the part 1 facing away from the first electrode 31. For example, the connection layer 40 is a radiation-transmissive electrically conductive layer, for instance an ITO layer. By means of an electrical connection 4, for instance a connection wire or a bond wire, the connection layer 40 or another electrical contact position of the part 1 may be electrically conductively connected to the second electrode 32. In the regions of the cavities 2K, the second electrode 32 may be electrically contactable and/or exposed in regions.

Figure 1B:
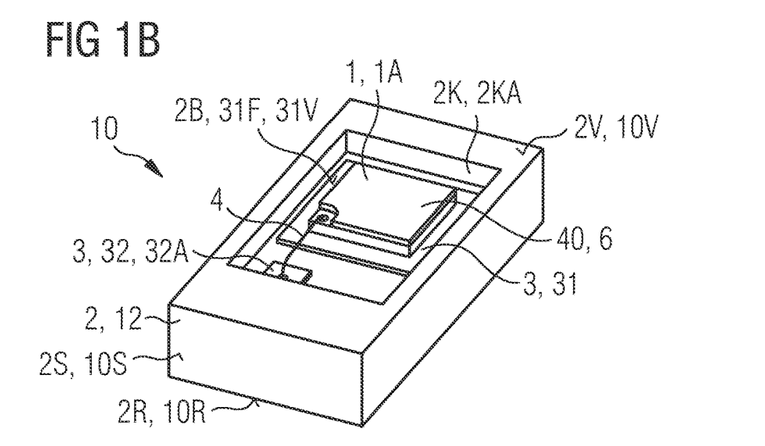
Figure 1C:
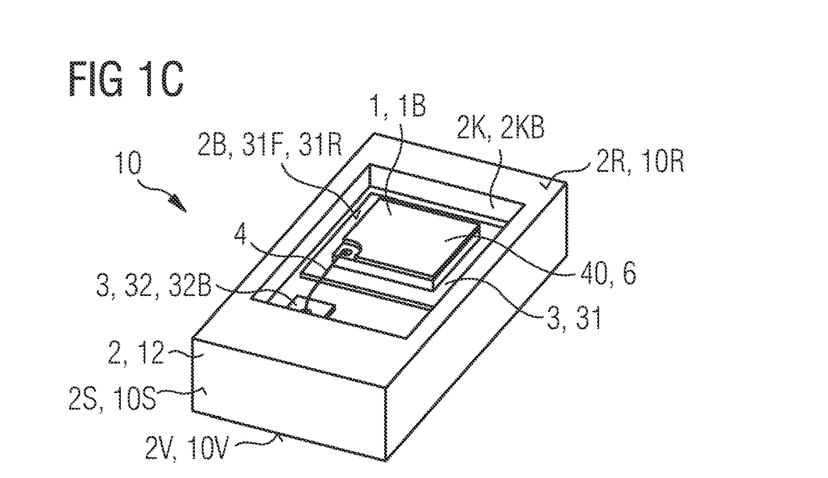
Figure 2A:
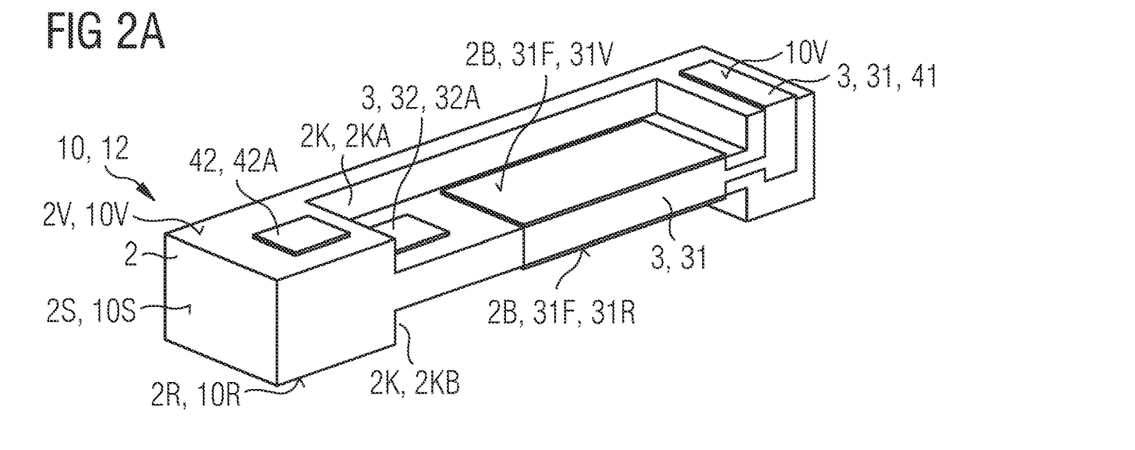
FIGS. 2A, 2B and 2C show one exemplary embodiment of a housing of a component in a three-dimensional sectional view, in a plan view of a front side of the housing and in a plan view of a rear side of the housing.
Figure 2B:
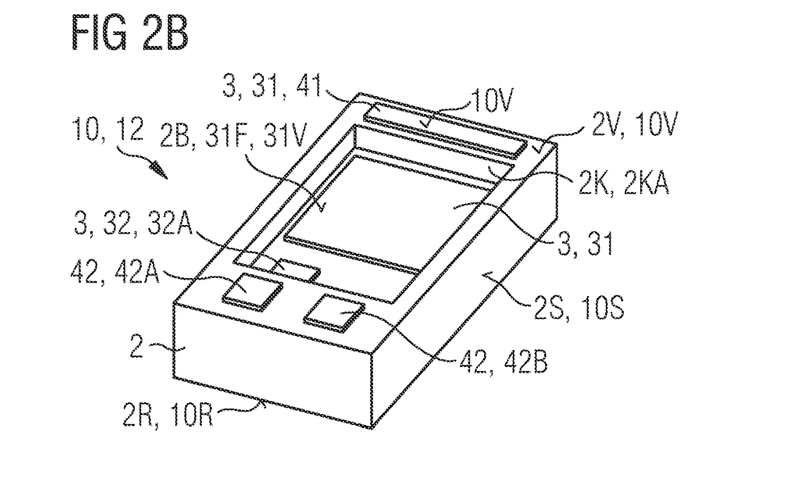
Figure 2C:
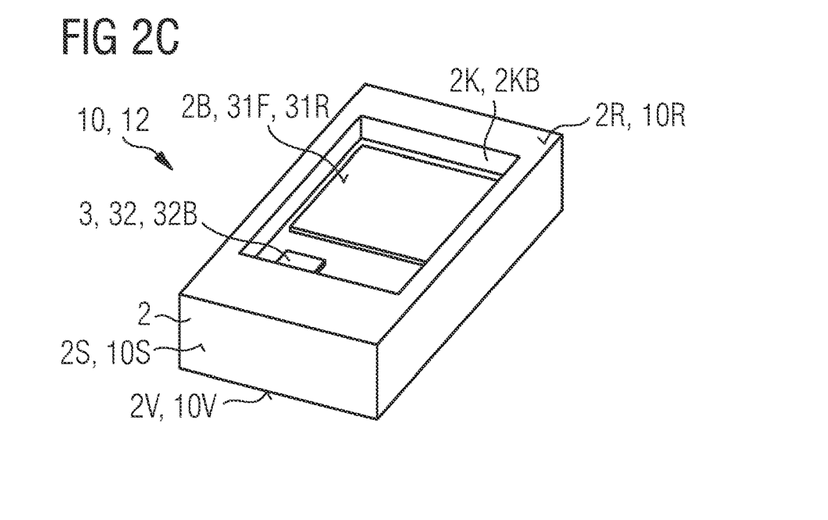

The second electrode 32 may comprise a first subregion 32A and a second subregion 32B (FIGS. 1B and 1C). The first subregion 32A and the second subregion 32B may be electrically insulated from one another. For example, the first subregion 32A is adapted for electrical contacting of the first part 1A and is, in particular, freely accessible in regions on the bottom surface 2B of the first cavity 2KA (FIG. 1B). The first subregion 32A may be electrically contactable outside the first cavity 2KA via the second connection position 42A. The second subregion 32B may be adapted for electrical contacting of the second part 1B. For example, the second subregion 32B is freely accessible in regions on the bottom surface 2B of the second cavity 2KB (FIG. 1C). The second subregion 32B may be electrically contactable outside the second cavity 2KB via the second further connection position 42B (FIGS. 2A, 2B and 2C).

The cavities 2K, in particular the first cavity 2KA and/or the second cavity 2KB, may according to FIG. 1A be filled with an encapsulation 7. In a plan view of the bottom surface 2B, the encapsulation 7 may fully cover the first part 1A and/or the second part 1B. For example, the encapsulation 7 is flush with the front side 2V or with the rear side 2R of the housing body 2 outside the cavity 2K in the vertical direction. In the regions of the cavities 2K, the front-side main surface 10V or the rear-side main surface 10R of the component may be formed in regions by a surface of the encapsulation 7. The encapsulation 7 may be configured to be radiation-transmissive. If the part 1A or 1B is not adapted for generation or for detection of electromagnetic radiation, it is also conceivable for the encapsulation 7 to be configured to be radiation-opaque.

It is possible for radiation-scattering and/or radiation-reflecting particles to be embedded in the encapsulation 7. The encapsulation 7 may comprise phosphor particles, which are adapted in particular to convert electromagnetic radiation of a first peak wavelength into electromagnetic radiation of a second peak wavelength, the first peak wavelength being less than the second peak wavelength, for example less by at least 30 nm, 70 nm or by at least 150 nm.

During operation of the component 10, the first part 1A and/or the second part 1B may be adapted to emit electromagnetic radiation in the visible, ultraviolet or in the infrared spectral range. For example, the first part 1A and/or the second part 1B may be adapted to emit electromagnetic radiation of a first peak wavelength, which is partially converted by phosphor particles into electromagnetic radiation of a second peak wavelength.

It is possible for the part 1 to comprise a converter layer 6 which is arranged indirectly or, in particular, directly on a surface of the part 1 facing away from the first electrode 31. The converter layer 6 may comprise phosphor particles. The encapsulation 7 may in this case be free of phosphor particles.

In FIG. 1B, the exemplary embodiment of a component 10 represented in FIG. 1A is represented in a plan view of the front side 2V of the housing body 2. In contrast to FIG. 1A, the encapsulation 7 is not represented in FIG. 1B. Unlike in FIG. 1A or FIG. 2B, the electrical connection positions 41, 42, 42A or 42B are not represented in FIG. 1B.

According to FIG. 1B, the bottom surface 2B of the first cavity 2KA is formed in regions from surfaces of the first electrode 31, of the second electrode 32 and of the front side 2V of the housing body 2. In other words, the first electrode 31 and the second electrode 32, in particular the first subregion 32A of the second electrode 32, are exposed in regions inside the cavity 2KA. In a plan view of the front side 2V of the housing body 2, the first electrode 31 and the second electrode 32 are laterally separated by a subregion of the housing body 2. This subregion of the housing body 2 may be bridged by an electrical connection 4, for instance a wire connection, the electrical connection 4 for example electrically connecting the connection layer 40 or a contact position of the part 1 to the second electrode 32, in particular to the first subregion 32A of the second electrode 32.

In FIG. 1C, the exemplary embodiment of a component 10 represented in FIG. 1A is represented in a plan view of the rear side 2R of the housing body 2. The structure, represented in FIG. 1C, of the component 10 on the rear side corresponds substantially to the structure, represented in FIG. 1A, of the component 10 on the rear side. In contrast thereto, a second subregion 32B of the second electrode 32 is exposed and/or electrically contactable in regions in the second cavity 2KB. By means of an electrical connection 4, for instance a wire connection, the second subregion 32B or the second electrode 32 may be electrically conductively connected to a connection layer 40 or a contact position of the second part 1B.

It is possible for at least 40%, 50%, 60%, 70% or at least 80% of the entire bottom surface 2B of the cavity 2K, for instance of the first cavity 2KA or of the second cavity 2KB, to be formed by a surface 31F of the first electrode 31, and/or surface 32F of the second electrode 32, exposed in the cavity 2K.

FIGS. 2A, 2B and 2C represent a housing 12 for a part 10, represented for instance in FIGS. 1A, 1B and 1C, schematically in a three-dimensional sectional view, in a plan view of a front side of the housing 12, and in a plan view of a rear side of the housing 12, respectively. In particular for reasons of clarity, no parts 1 are represented in FIGS. 2A, 2B and 2C.

In FIG. 2A, the second subregion 32A and/or the second connection position 42A of the second electrode 32 are/is electrically contactable on the front side 2V of the housing body 2. The second subregion 32A and the second connection position 42A are expediently electrically conductively connected to one another, for instance by a further subregion, which is in particular embedded in the housing body 2, of the second electrode 32. In plan view, the second connection position 42A is located outside the cavity 2K. The second electrode 32, in particular the second subregion 32A of the second electrode 32, is electrically contactable and/or at least in regions uncovered by the housing body 2 in the region of the cavity 2K. In a similar way to the second electrode 32, the first electrode 31 is in particular electrically contactable both inside and outside the cavity 2K on the front side 2V or on the rear side 2R of the housing body 2. Outside the cavity 2K, the component 10 or the housing 12 comprises the first connection position 41 on the front side 2V. The first connection position 41 is arranged on a first edge region of the housing body 2. The second connection position 42 or 42A is arranged on a second edge region of the housing body 2 opposite to the first edge region.

The exemplary embodiment of a housing 12 represented in FIG. 2B corresponds to the exemplary embodiment of a housing 12 represented in FIG. 2A. In contrast thereto, a further second connection position 42B is represented. The second connection position 42A and the further second connection position 42B are, in particular, arranged next to one another on the second edge region of the housing body 2.

FIG. 2C represents the housing 12 in a plan view of the rear side 2R of the housing body 2. The second electrode comprises a second subregion 32B. The second subregion 32B is not covered by the housing body 2 at least in regions inside the second cavity 2KB. Outside the second cavity 2KB, the rear side 2R is in particular free of connection positions 41, 42, 42A and/or 42B.

FIGS. 3A, 3B, 3C, 3D and 3F schematically represent some method steps for the production of a component 10, for instance represented in FIG. 1A.

Figure 3A:
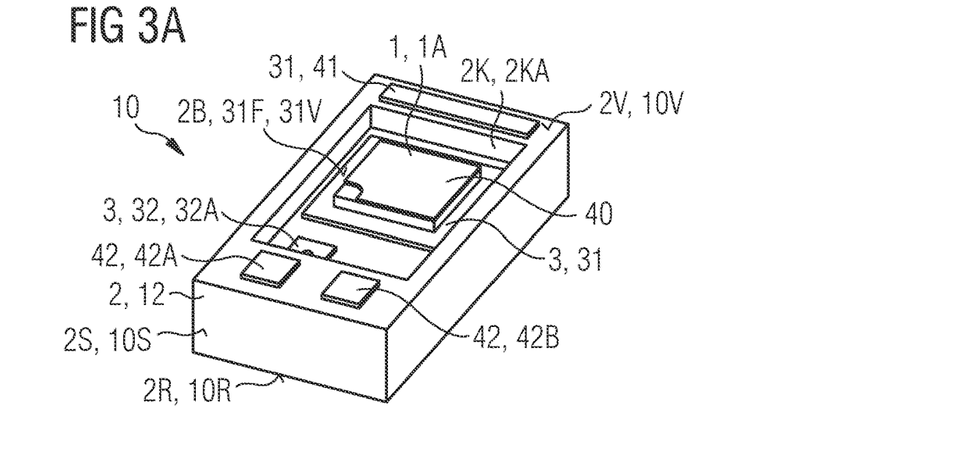
FIGS. 3A, 3B, 3C, 3D, 3E and 3F show schematic representations of some method steps of one exemplary embodiment of a method for producing a component.

According to FIG. 3A, a lead frame 3 having a first, in particular continuous, electrode 31 and a second electrode 32 is provided. A housing body 2 is, for example, applied by means of a molding method onto the lead frame 3 in such a way that the first electrode 31 and the second electrode 32 are enclosed, in particular fully enclosed, laterally. In this case, a front side 31V and/or a rear side 31R of the first electrode 31 may be free of coverage by a material of the housing body 2 at least in regions. The housing body 12 represented in FIG. 3A for the component 10 corresponds substantially to the housing 12 represented in FIGS. 2A, 2B and 2C for a component 10.

According to FIG. 3A, a first part 1A is fixed inside the first cavity 2KA on the front side 31V of the first electrode 31. In particular, the first part 1A is in electrical contact with the first electrode 31. For example, the first part 1A comprises a contact position which faces toward the first electrode 31 and is in electrical contact with the first electrode 31.

Figure 3B:
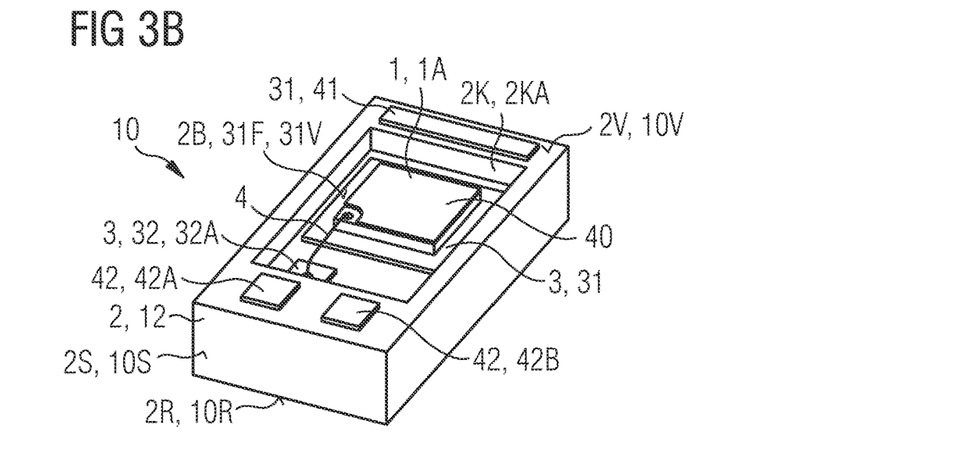
Figure 3C:
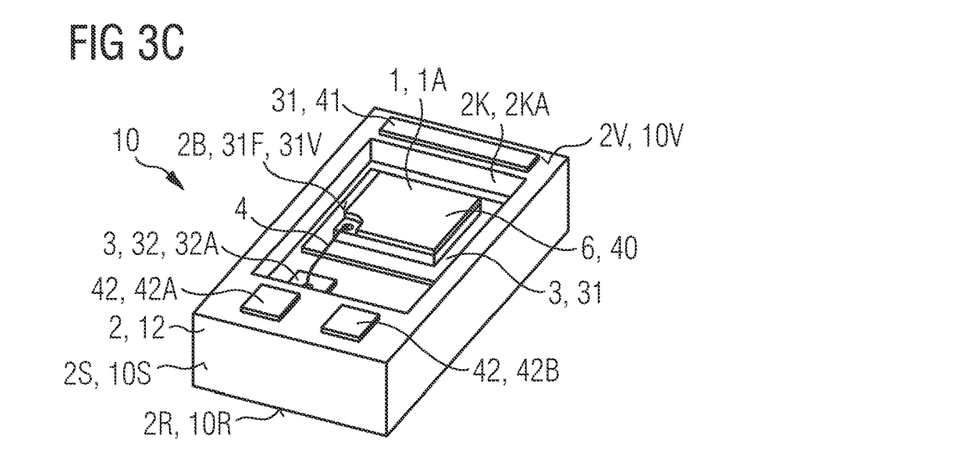

According to FIG. 3B, a wire connection is formed between a first subregion 32A of the second electrode 32 and a connection layer 40 or a further contact position, facing away from the first electrode 31, of the first part 1A. A converter layer 6 and/or an encapsulation 7 may be applied onto the first part 1A, in particular after electrical connection of the first part 1A to the first electrode 31 and to the second electrode 32. For example, the encapsulation 7 may fully fill the first cavity 2KA.

Figure 3D:
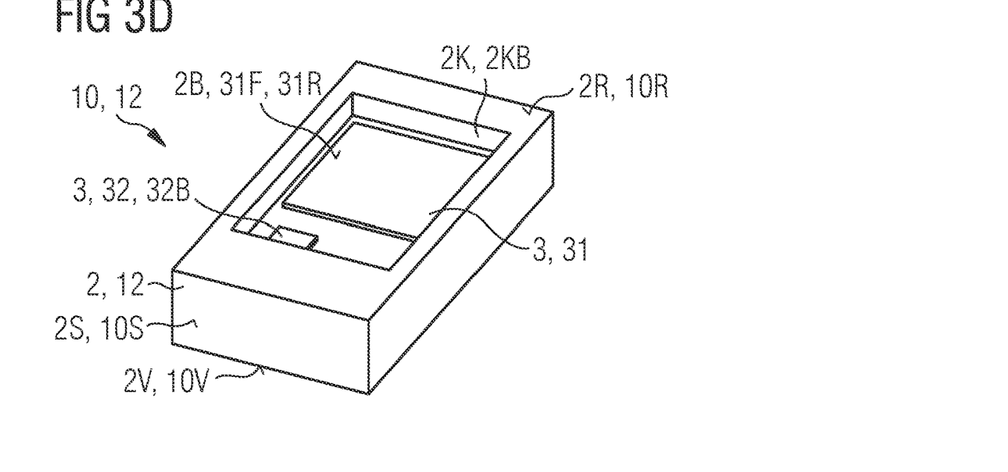
Figure 3E:
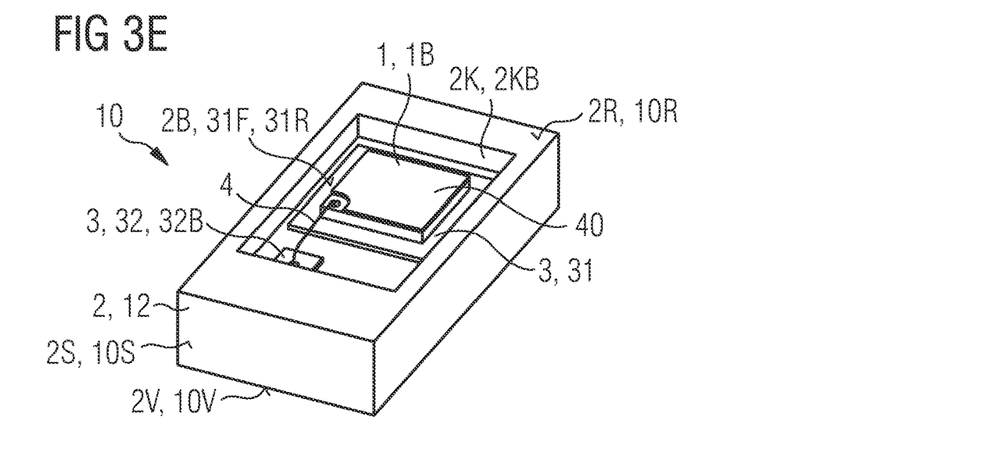
Figure 3F:
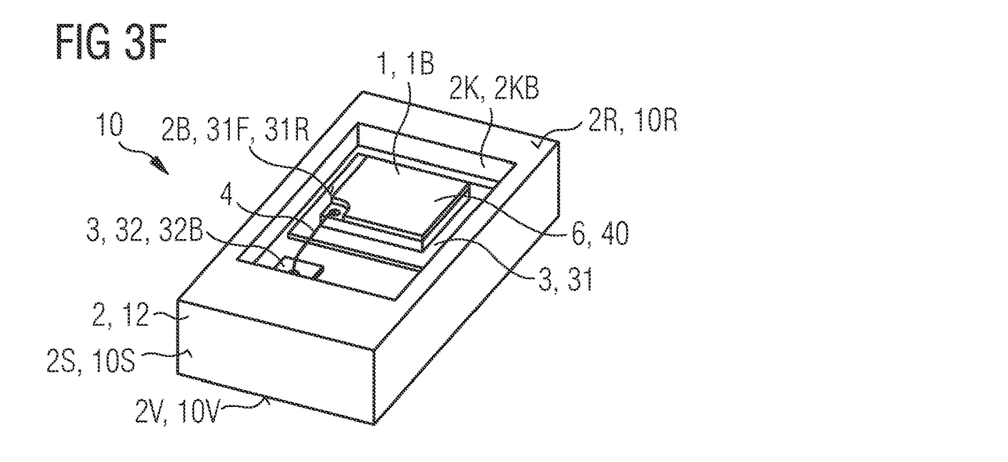

In a similar way to the mechanical fixing and electrical contacting of the first part 1A, according to FIGS. 3D, 3E and 3F a second part 1B is mechanically fixed and electrically contacted on a rear side 31R of the first electrode 31. By means of an electrical connection, for instance a wire connection, the second part 1B may be electrically conductively connected to a second subregion 32B of the second electrode 32. In a similar way to the first part 1A, the second part 1B may be covered by a converter layer 6 or by an encapsulation 7. The encapsulation 7 may cover the second cavity 2KB partially or fully.

Figure 4A:
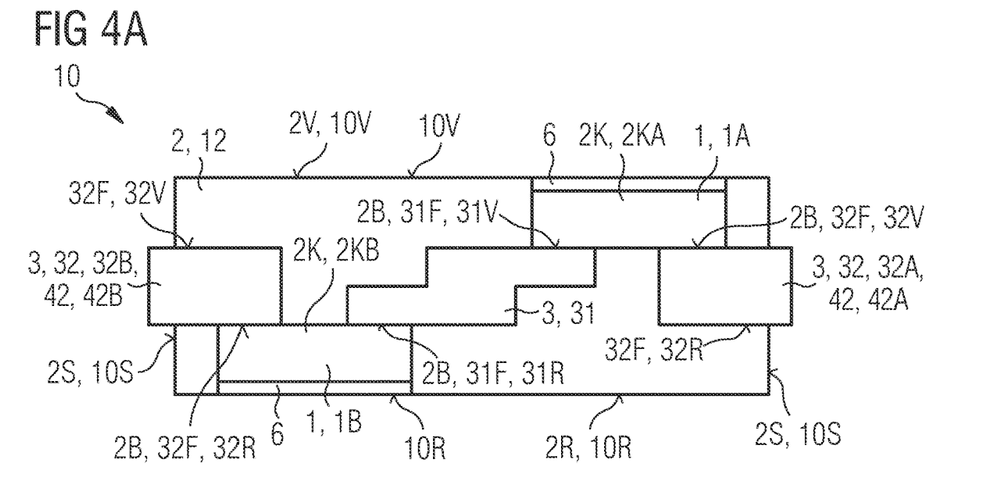
FIGS. 4A, 4B and 4C show a further exemplary embodiment of a component in a sectional view, in a plan view of a front side of the component and in a plan view of a rear side of the component.

FIG. 4A shows a further exemplary embodiment of a component 10. The exemplary embodiment of a component 10 represented in FIG. 4A corresponds substantially to the exemplary embodiment of a component 10 represented in FIG. 1A. In contrast thereto, the part 1, 1A or 1B partially covers both the first electrode 31 and the second electrode 32 in a plan view of the lead frame 3. In plan view, the part 1, 1A or 1B may bridge a region of the housing body 2 arranged between the electrodes 31 and 32.

In particular, the first part 1A fully fills the first cavity 2KA. The second part 1B may fully fill the second cavity 2KB. It is possible for the component 10 to comprise a multiplicity of parts 1, the parts 1 respectively fully filling a cavity 2K associated with them. In other words, the parts 1 may respectively be fully enclosed laterally by the housing body 2. In particular, the parts 1, 1A and/or 1B of the component 10 directly adjoin the housing body 2 in the lateral directions. The part 1, 1A or 1B may be configured as a surface-mountable part. Such a part 1 comprises, in particular, contact positions that are arranged only on a rear side, facing toward the electrodes 31 and 31, of the part 1.

As a further difference from the exemplary embodiment of a component 10 represented in FIGS. 1A, 1B and 1C, the first electrode 31 and/or the second electrode 32 may protrude laterally beyond the side surface 2S of the housing body 2. It is also possible for the first electrode 31 and/or the second electrode 32 to extend laterally as far as a side surface 2S of the housing body 2. The first electrode 31 and/or the second electrode 32 may be configured to be electrically contactable on the side surface 2S of the housing body 2 or on a side surface 10S of the component 10. The lateral connection position 41 of the first electrode 31 and the second connection positions 42, 42A and 42B of the second electrode 32 are schematically represented, for instance, in FIG. 4B in a plan view of the front-side main surface 10V of the component 10. The connection positions 41, 42A and 42B are respectively arranged on a side surface 2S or 10S.

Figure 4B:
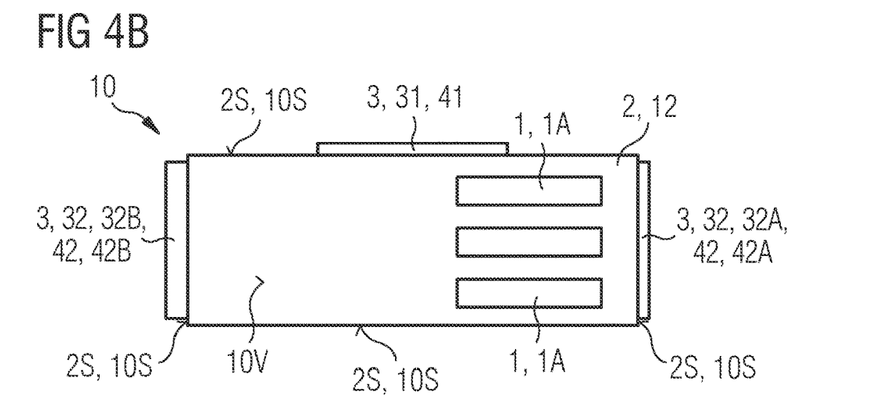

According to FIG. 4B, the component may comprise a multiplicity of first parts 1A. The first parts 1A are respectively arranged in a cavity 2K. By means of the first connection position 41 and the second connection position 42A, the first part 1A or the multiplicity of first parts 1A may be electrically contacted.

Figure 4C:
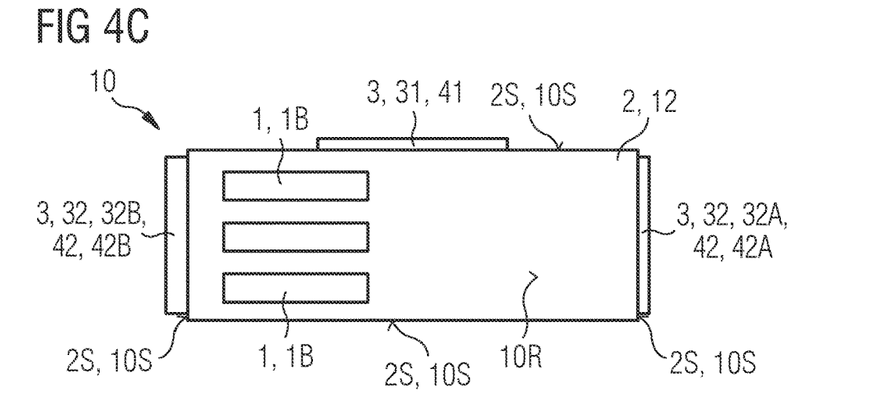

FIG. 4C represents the component 10 represented in FIG. 4A in a plan view of the rear-side main surface 10R of the component 10. The component 10 comprises a multiplicity of second parts 1B. The second parts 1B are respectively arranged in a cavity 2K or 2KB. The second part 1B or the multiplicity of second parts 1B may be electrically contacted via the first connection position 41 and via the further second connection position 42B.

FIGS. 5A, 5B, 5C, 5D and 5E show some method steps of a further exemplary embodiment of a method for producing a component 10.

Figure 5A:
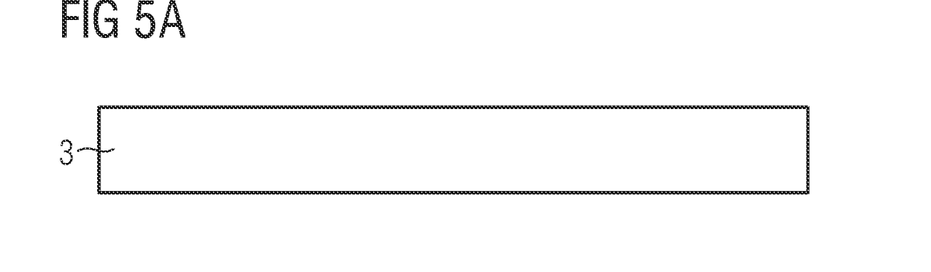
FIGS. 5A, 5B, 5C, 5D and 5E show schematic representations of some method steps of a further exemplary embodiment of a method for producing a component.

According to FIG. 5A, a lead frame 3 is provided. Preferably, the lead frame 3 has a minimum vertical thickness of about 75 µm or 100 µm. For example, the vertical layer thickness of the lead frame is between 75 µm and 500 µm inclusive, preferably between 100 µm and 350 µm inclusive or between 150 µm and 250 µm inclusive.

The lead frame 3 may be structured into a first electrode 31 and a second electrode 32, or into a multiplicity of first electrodes 31 and a multiplicity of second electrodes 32. For example, an etching method or a mechanical method is suitable for this. For an individual component 10, the first electrode 31 is in particular formed to be continuous or in one piece. For an individual component 10, the second electrode 32 may be formed to be continuous and in one piece. As an alternative, it is possible for the second electrode 32 to comprise a first subregion 32A and a second subregion 32B laterally separated from the first subregion 32A.

Figure 5B:
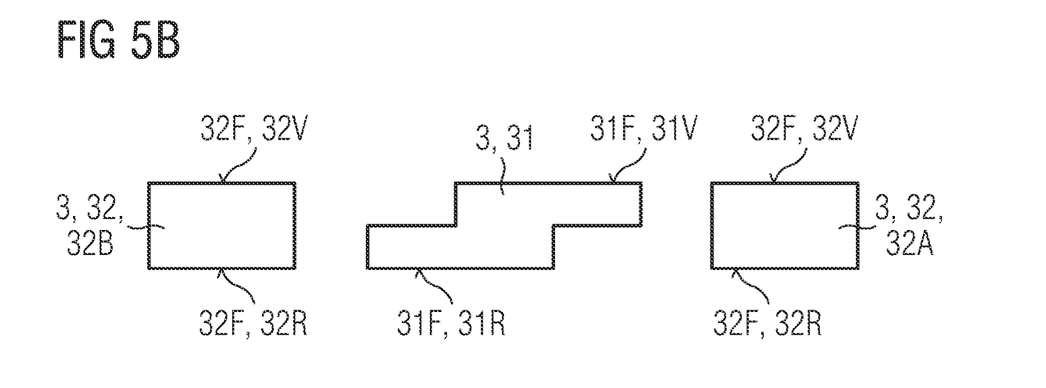

According to FIG. 5B, the lead frame 3, which in particular is originally configured to be continuous, may be structured in such a way that the first electrode 31 is separated from the second electrode 32 by material removal. A front side 31V and/or a rear side 31R of the first electrode 31 may assume the shape of a step. The first electrode 31 comprises, in particular, two such steps. It is possible for the second electrode 32 to comprise at least one such step. The step has, in particular, a vertical height of between 25 µm and 200 µm inclusive, for instance between 50 µm and 175 µm inclusive or between 75 µm and 125 µm inclusive.

Figure 5C:
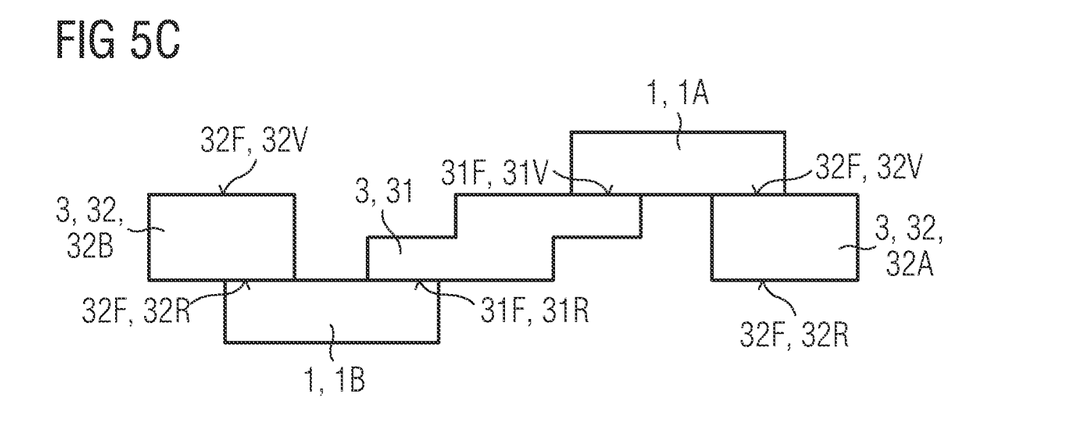

According to FIG. 5C, a first part 1A is mechanically fastened on a front side 31V of the first electrode 31 and on a front side 32V of the second electrode 32. A mounting surface for the first part comprises a partial surface of the front side 31V of the first electrode 31 and a partial surface of the front side 32V of the second electrode 32. The first part 1A may be a surface-mountable part, so that during the mechanical fixing on the electrodes 31 and 32 the first part 1A is already electrically conductively connected to them.

In a similar way to the first part 1A, a second part 1B may be mechanically fixed and electrically contacted on a rear side 31R of the first electrode 31 and on a rear side 32R of the second electrode 32. In a plan view of the lead frame 3, the first part 1A and/or the second part 1B may have overlaps both with the first electrode 31 and with the second electrode 32. A lateral intermediate region between the electrodes 31 and 32 is in plan view bridged, for instance, by the first part 1A or by the second part 1B. In particular, the first electrode 31 forms a common electrode for the first part 1A and the second part 1B. In contrast to FIG. 5C, a multiplicity of first parts 1A and/or a multiplicity of second parts 1B may be fastened on the lead frame 3.

Figure 5D:
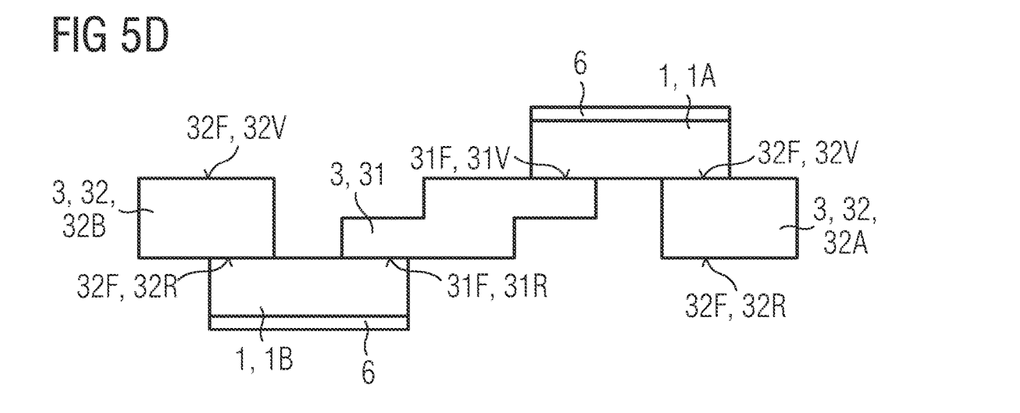

The exemplary embodiment of a method step represented in FIG. 5D corresponds substantially to the method step represented in FIG. 5C. In contrast thereto, the parts 1, 1A and 1B respectively comprise a converter layer 6. The converter layer 6 is arranged on a surface of the part 1 facing away from the electrodes 31 and 32.

Figure 5E:
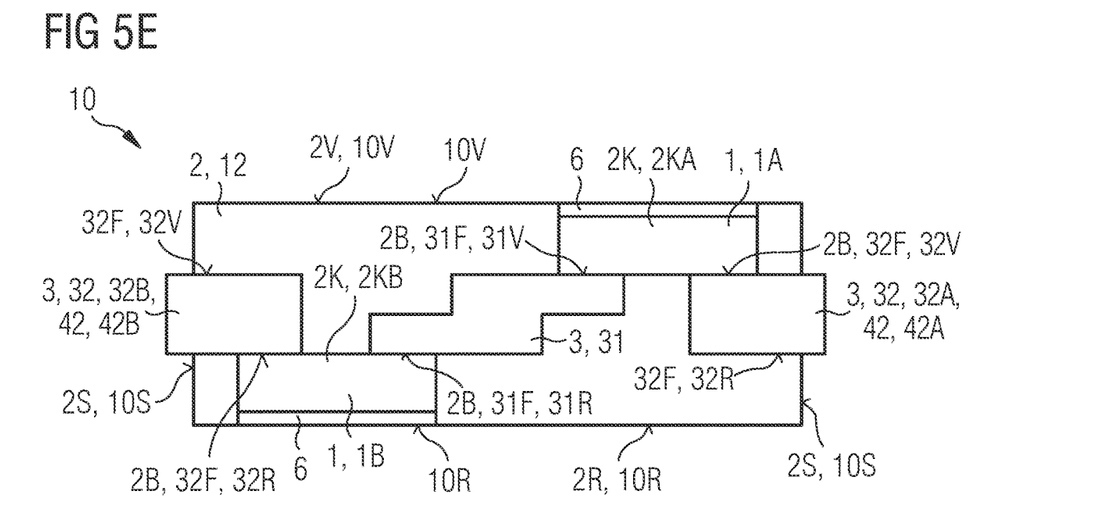

According to FIG. 5E, a housing body 2 is formed, in particular by means of a film-assisted molding method, for instance after the fixing of the parts 1. The first electrode 31 and/or the second electrode 32 may be laterally enclosed by the housing body 2, in such a way that the first electrode 31 and/or the second electrode 32 protrude/protrudes laterally beyond a side surface 2S of the housing body 2 in regions. In a plan view of the front-side main surface 10V of the component 10 or of the rear-side main surface 10R of the component 10, the first electrode 31 and/or the second electrode 32 may be free of coverage by a material of the housing body 2 in regions. The uncovered regions of the first electrode 31 and/or of the second electrode 32 may in turn be covered, in particular fully covered, by the first part 1A or by the second part 1B.

The method described in FIGS. 3A, 3B, 3C, 3D, 3E and 3F and the method described in FIGS. 5A, 5B, 5C, 5D and 5E for producing a component 10 are also suitable for the production of a multiplicity of components 10. In this case, a housing panel may be produced, the housing panel being singulated in order to produce a multiplicity of components 10. The side surfaces 2S of the housing body 2 or the side surfaces 10S of the component 10 may comprise method-specific singulation tracks.

The priority of German Patent Application 10 2018 100 946.1 is claimed, the disclosure content of which is incorporated here by reference.

By the description of the invention with the aid of the exemplary embodiments, the invention is not restricted to the latter. Rather, the invention comprises any new feature and any combination of features, which in particular includes any combination of features in the claims, even if this feature or this combination itself is not explicitly specified in the claims or exemplary embodiments.

LIST OF REFERENCES 10 component
10V front-side main surface of the component 10R rear-side main surface of the component
10S side surface of the component
12 housing of the component
1 part
1A first part
1B second part
2 housing body
2K cavity of the housing body
2KA cavity/first cavity
2KB cavity/second cavity
2B bottom surface of the cavity
2V front side of the housing body
2R rear side of the housing body
2S side surface of the housing body
3 lead frame
31 first electrode
31F surface of the first electrode
31V front side of the first electrode
31R rear side of the first electrode
32 second electrode
32A first subregion of the second electrode
32B second subregion of the of the second electrode
32F surface of the second electrode
32V front side of the second electrode
32R rear side of the second electrode
4 electrical connection/connection wire/bond wire
40 connection layer
41 first connection position
42 second connection position
42A second connection position of the first part
42B second connection position of the second part
5 connection layer
6 converter layer
7 encapsulation

The invention claimed is:

1. A component comprising a first part, a second part, a housing body and a first electrode, wherein
the housing body fully encloses the first electrode in lateral directions,
the first electrode comprises a front side and a rear side facing away from the front side, the front side and the rear side being free of coverage by a material of the housing body at least in regions,
the first part is arranged on the front side and is electrically conductively connected to the first electrode,
the second part is arranged on the rear side and is electrically conductively connected to the first electrode,
the first electrode is formed to be continuous and is arranged between the first part and the second part in a vertical direction,
the housing body comprises two cavities,
the cavities respectively being formed as an opening of the housing body and being fully enclosed by the housing body in lateral directions,
bottom surfaces of the cavities respectively being formed in regions by surfaces of the first electrode, of a second electrode and of the housing body, and
the first part and the second part respectively being arranged in one of the two cavities, a mounting surface for the first part or the second part being formed exclusively by an uncovered surface of the first electrode, and the uncovered surface being free of coverage by the housing body in plan view,
all side surfaces of the component are formed by side surfaces of the housing body, and wherein all of the side surfaces of the component are free of an electrically conductive material or free of electrical connection positions of the component, and
the first electrode is configured to be electrically contactable on a front-side main surface or on a rear-side main surface of the component.

2. The component as claimed in claim 1, wherein the first electrode is formed in one piece.

3. The component as claimed in claim 1, wherein the first part and the second part respectively adjoin the first electrode directly at most except for a connection layer.

4. The component as claimed in claim 1, wherein the first electrode is configured to be electrically contactable on the front-side main surface of the component.

5. The component as claimed in claim 1, wherein the first part or the second part is a light-emitting semiconductor chip.

6. The component as claimed in claim 1, wherein the first part is a light-emitting semiconductor chip and the second part is a sensor.

7. The component as claimed in claim 1, wherein the second electrode is electrically conductively connected to the first part and/or to the second part, both the first electrode and the second electrode directly adjoining the housing body.

8. The component as claimed in claim 7, wherein the first electrode and the second electrode are formed from a same material.

9. The component as claimed in claim 1, which comprises the front-side main surface and the rear-side main surface, wherein
the front-side main surface and the rear-side main surface delimit the component in vertical directions,
the front-side main surface is formed in regions by a front side of the housing body, and
the rear-side main surface is formed in regions by a rear side of the housing body.

10. A method for producing a component as claimed in claim 1, comprising the following steps:
providing a lead frame having the first electrode;
forming the housing body by means of a molding method, so that the first electrode is laterally enclosed by the housing body in such a way that the first electrode comprises the front side and the rear side facing away from the front side;
fixing the first part on the front side of the first electrode after formation of the housing body; and
fixing the second part on the rear side of the first electrode after formation of the housing body.

11. A method for producing a component as claimed in claim 1, comprising the following steps:
providing a lead frame having the first electrode;
fixing the first part on the front side of the first electrode;
fixing the second part on the rear side of the first electrode; and
forming a housing body by means of a film-assisted molding method after fixing of the first part and the second part, so that the first electrode is laterally enclosed by the housing body in such a way that the front side and the rear side of the first electrode are respectively free of coverage by the material of the housing body in regions in plan view.

* * * * *